(12) United States Patent
Yu et al.

(10) Patent No.: US 12,429,389 B2
(45) Date of Patent: Sep. 30, 2025

(54) MULTI-PARAMETER SENSING SYSTEM

(71) Applicant: SHENZHEN NEW DEGREE TECHNOLOGY CO., LTD., Guangdong (CN)

(72) Inventors: Jinbo Yu, Guangdong (CN); Zhiyun Chen, Guangdong (CN); Changfeng Zhu, Guangdong (CN); Hao Li, Guangdong (CN)

(73) Assignee: SHENZHEN NEW DEGREE TECHNOLOGY CO., LTD., Shenzhen (CN)

(*) Notice: Subject to any disclaimer, the term of this patent is extended or adjusted under 35 U.S.C. 154(b) by 390 days.

(21) Appl. No.: 17/912,837

(22) PCT Filed: Feb. 8, 2021

(86) PCT No.: PCT/CN2021/075912
§ 371 (c)(1),
(2) Date: Sep. 19, 2022

(87) PCT Pub. No.: WO2021/185000
PCT Pub. Date: Sep. 23, 2021

(65) Prior Publication Data
US 2023/0141257 A1 May 11, 2023

Related U.S. Application Data

(60) Provisional application No. 63/064,086, filed on Aug. 11, 2020, provisional application No. 62/992,000, filed on Mar. 19, 2020.

(51) Int. Cl.
*G01L 1/22* (2006.01)
*G01L 1/14* (2006.01)
(Continued)

(52) U.S. Cl.
CPC ............ *G01L 1/2293* (2013.01); *G01L 1/148* (2013.01); *G01L 1/2262* (2013.01);
(Continued)

(58) Field of Classification Search
None
See application file for complete search history.

(56) References Cited

U.S. PATENT DOCUMENTS

| 4,556,115 A | 12/1985 | Lockery et al. |
| 4,771,638 A | 9/1988 | Sugiyama et al. |

(Continued)

FOREIGN PATENT DOCUMENTS

| CN | 1049718 | 3/1991 |
| CN | 1460846 A | 12/2003 |

(Continued)

OTHER PUBLICATIONS

Office Action issued in CN202180018343.9, dated Mar. 7, 2024, 7 pages.

(Continued)

*Primary Examiner* — John E Breene
*Assistant Examiner* — Nigel H Plumb
(74) *Attorney, Agent, or Firm* — Nixon & Vanderhye, P.C.

(57) ABSTRACT

The present application discloses a strain sensing film, a pressure sensor, and a strain sensing system; the strain sensing film includes a semiconductor film, and by arranging a temperature sensor in the semiconductor film, the sensitivity of the strain sensing film is adjusted according to an effective gauge factor obtained from a calibration test and a correlation table reflecting a correlation between an effective gauge factor and a temperature, a better effective gauge factor compensation is achieved, a high sensitivity of the strain gauge of the semiconductor film can be fully utilized.

(Continued)

The strain sensing film can be widely used in application scenarios that need to measure local strain or strain variation, force or force variation, pressure or pressure change, displacement, deformation, bending, or bending deformation.

18 Claims, 3 Drawing Sheets

(51) Int. Cl.
*H10D 1/43* (2025.01)
*H10D 1/47* (2025.01)
*G01L 1/18* (2006.01)
*G06F 3/041* (2006.01)

(52) U.S. Cl.
CPC .............. *G01L 1/2281* (2013.01); *H10D 1/43* (2025.01); *H10D 1/47* (2025.01); *G01L 1/18* (2013.01); *G06F 3/041* (2013.01); *G06F 2203/04105* (2013.01)

(56) References Cited

U.S. PATENT DOCUMENTS

| | | | |
|---|---|---|---|
| 2010/0307255 | A1 | 12/2010 | Totokawa et al. |
| 2015/0068315 | A1* | 3/2015 | Davis ................. G01L 19/0007 29/846 |

FOREIGN PATENT DOCUMENTS

| | | |
|---|---|---|
| CN | 101044382 A | 9/2007 |
| CN | 101046368 A | 10/2007 |
| CN | 201215517 Y | 4/2009 |
| CN | 101526411 A | 9/2009 |
| CN | 101566514 A | 10/2009 |
| CN | 101639391 | 2/2010 |
| CN | 101639391 A * | 2/2010 |
| CN | 101719482 A | 6/2010 |
| CN | 101807531 A | 8/2010 |
| CN | 101815933 A | 8/2010 |
| CN | 202255734 U | 5/2012 |
| CN | 202710236 U | 1/2013 |
| CN | 103712721 A | 4/2014 |
| CN | 104897333 A | 9/2015 |
| CN | 204652340 U | 9/2015 |
| CN | 105021341 A | 11/2015 |
| CN | 105021347 A | 11/2015 |
| CN | 105203019 A | 12/2015 |
| CN | 105224129 A | 1/2016 |
| CN | 105895540 A | 8/2016 |
| CN | 105895587 A | 8/2016 |
| CN | 205843877 U | 12/2016 |
| CN | 106301324 A | 1/2017 |
| CN | 106768524 A | 5/2017 |
| CN | 106855756 A | 6/2017 |
| CN | 206930343 U | 1/2018 |
| CN | 108027290 A | 5/2018 |
| CN | 108037844 A | 5/2018 |
| CN | 108365021 A | 8/2018 |
| CN | 207964135 U | 10/2018 |
| CN | 108917587 A | 11/2018 |
| CN | 109238525 | 1/2019 |
| CN | 109399556 A | 3/2019 |
| CN | 109781314 | 5/2019 |
| CN | 109844447 | 6/2019 |
| CN | 110174198 A | 8/2019 |
| CN | 209264161 | 8/2019 |
| CN | 110806172 A | 2/2020 |
| CN | 111174687 A | 5/2020 |
| EP | 0195232 A2 | 9/1986 |
| JP | 2017003365 A | 9/1986 |
| JP | 6302835 A | 10/1994 |
| JP | 2007263781 A | 10/2007 |
| JP | 2007281051 A | 10/2007 |
| JP | 61-214582 A | 11/2015 |
| WO | 2015/038320 | 3/2015 |
| WO | 2017133016 A1 | 8/2017 |
| WO | 2017133017 A1 | 8/2017 |
| WO | 2018133054 A1 | 7/2018 |
| WO | 2018/231808 | 12/2018 |
| WO | 2019014866 A1 | 1/2019 |
| WO | 2019160349 A1 | 8/2019 |

OTHER PUBLICATIONS

Office Action issued in CN202180018123.6, dated Jun. 28, 2024, 10 pages.
International Search Report dated May 11, 2021, for PCT/CN2021/075912, 8 pp., including English translation.
Written Opinion of the ISA dated May 11, 2021, for PCT/CN2021/075912, 6 pp., including English translation.

* cited by examiner

MULTI-PARAMETER SENSING SYSTEM

CROSS REFERENCE TO RELATED APPLICATIONS

This application is a National Stage Application of International Patent Application No. PCT/CN2021/075912, with an international filing date of Feb. 8, 2021, which is based on a US provisional patent application, with Application No. 62/992,000, filed on Mar. 19, 2020, and a US provisional patent application, with Application No. 63/064,086, filed on Aug. 11, 2020. The contents of all of the aforementioned applications, including any intervening amendments thereto, are incorporated herein by reference.

TECHNICAL FIELD

The present application relates to technical field of sensors, and more particularly to a strain sensing film, a pressure sensor, and a strain sensing system.

BACKGROUND

At present, pressure sensors include a resistance strain gauge type, a capacitive sensing type, and a piezoelectric ceramic type. These pressure sensors are all shaped according to complex circuit design and structural design. For example, as for the resistance strain gauge type, it is necessary to select the strain gauges that meet the requirements of resistors and deviations among the many produced strain gauges. Furthermore, the strain gauges are combined to have a certain circuit configuration, and then the circuit configuration is connected to the sensor structure through an adhesive. The pressure deformation amount of the strain gauge is low, so that the sensor structure needs to be accurately positioned and carefully adhered; as for the capacitive sensing type, the distance between each capacitive point and the panel needs to be strictly controlled, and pressure information is obtained through the change of distance, extremely high machining accuracy and assembling accuracy are required in the manufacturing process of the capacitive sensing type of pressure sensors; as for the piezoelectric ceramic type of pressure sensors, the pressure is obtained from a transient voltage change by applying an instantaneous impact on the piezoelectric ceramic, and the manufacturing of the piezoelectric ceramic type pressure sensor needs uniform and consistent piezoelectric ceramic pieces, and needs to be mounted on the preset structure by a special mounting method.

However, the existing pressure sensors need to determine a temperature of a temperature sensor through external temperature information, and cannot obtain the temperature information of the sensor, which has the problems of weak anti-interference to external environment interference and inaccurate pressure measurement.

SUMMARY

One of objects of an embodiment of the present application is to provide a strain sensing film, a pressure sensor, and a strain sensing system, which has the technical advantages including but not to, enhance the anti-interference of the pressure sensor to external environment, and to improve the accuracy of pressure measurement of the pressure sensor, in the production and using process of the pressure sensor.

In order to solve above-mentioned technical problem, the technical solution adopted by the present application are:

In a first aspect, a strain sensing film is provided, and the strain sensing film includes: a semiconductor film; and a temperature sensor is arranged in the semiconductor film.

In an embodiment, the strain sensing film is provided therein with a signal processing circuit configured for receiving a detected temperature signal output by the temperature sensor and configured for determining a sensitivity adjustment for a sensor according to a correlation table that reflects a correlation between an effective gauge factor and a temperature.

In an embodiment, the semiconductor film includes at least one selected from the group consisting of a silicon film, a germanium film, a gallium arsenide film, a gallium nitride film, a silicon carbide film, a zinc sulfide film, a zinc oxide film, and any combination thereof.

In an embodiment, the semiconductor film is provided with at least one resistor and a bridge contact electrode connected with a Wheatstone bridge or a half-Wheatstone bridge, and configured for outputting a bridge voltage signal.

In an embodiment, the semiconductor film is provided with a plurality of resistors, the plurality of resistors form a Wheatstone bridge or a half-Wheatstone bridge, and the plurality of resistors arranged to be adjacent to each other.

In an embodiment, the semiconductor film is provided with a temperature contact electrode connected to the temperature sensor and configured for outputting a detected temperature signal.

In an embodiment, the semiconductor film is provided with a bridge contact electrode connected with a Wheatstone bridge or a half-Wheatstone bridge, and configured for outputting a bridge voltage signal.

In an embodiment, the semiconductor film is provided with at least two resistors, one resistor and at least another resistor respond differently to a strain.

In an embodiment, the semiconductor film is provided with at least two resistors, one resistor and at least another resistor are placed in different directions.

In an embodiment, the semiconductor film is provided with at least two resistors, one resistor and at least another resistor have different gauge factors.

In an embodiment, the semiconductor film is provided with at least two resistors, one resistor is perpendicular to at least another resistor.

In an embodiment, a thickness of the semiconductor film is less than or equal to 70 μm.

In an embodiment, a thickness of the semiconductor film is less than or equal to 50 μm.

In an embodiment, a thickness of the semiconductor film is less than or equal to 30 μm.

In an embodiment, a thickness of the semiconductor film is less than or equal to 25 μm.

In an embodiment, a thickness of the semiconductor film is less than or equal to 20 μm.

In an embodiment, a thickness of the semiconductor film is less than or equal to 15 μm.

In a second aspect, a pressure sensor is provided, and the pressure sensor includes a substrate; and at least one side surface of the substrate is provided with the strain sensing film above-mentioned.

In a third aspect, a strain sensing system is provided, the strain sensing system includes: a substrate; and the strain sensing film above-mentioned, and the strain sensing film is adhered with the substrate by an adhesive.

A strain sensing film, a pressure sensor, and a strain sensing system are provided in the embodiment of the pressure application; the strain sensing film includes a semiconductor film, and by arranging a temperature sensor in the semiconductor film, and the sensitivity of the strain sensing film is corrected according to the effective gauge factor obtained from the calibration test and the correlation table that reflects the correlation between the effective gauge factor and the temperature, better effective gauge factor compensation is achieved, high sensitivity of the semiconductor film strain gauge can be fully utilized to realize better effective gauge factor compensation. The strain sensing film can be widely used in application scenarios that need to measure local strain or variation of strain, force or force variation, pressure or pressure change, displacement, deformation, bending or bending deformation.

BRIEF DESCRIPTION OF THE DRAWINGS

In order to illustrate the technical solutions in the embodiments of the present application more clearly, the following briefly introduces the accompanying drawings that are used in the description of the embodiments or exemplary technologies. Obviously, the drawings in the following description are only some embodiments the present application, for those skilled in the art, other drawings can also be obtained according to these drawings without any creative effort.

DETAILED DESCRIPTION OF EMBODIMENTS

In order to make the technical problem, the technical solution and the advantages of the present application be clearer and more understandable, the present application will be further described in detail below with reference to accompanying figures and embodiments. It should be understood that the specific embodiments described herein are merely intended to illustrate but not to limit the present application.

It is noted that when a component is referred to as being "fixed to" or "disposed on" another component, it can be directly or indirectly on another component. When a component is referred to as being "connected to" another component, it can be directly or indirectly connected to another component. In the description of the present application, it needs to be understood that, directions or location relationships indicated by terms such as "up", "down", "left", "right", and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application. In addition, terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s), in the description of the present application, "a plurality of" means two or more, unless there is additional explicit and specific limitation.

The temperature coefficient of resistance (TCR) represents the relative change of the resistance value of a resistor when the temperature changes by 1° C., and the unit is ppm/° C. (that is, $10^{-6}/°$ C.). The gauge factor (GF) of the resistance strain gauge represents the relative change of the strain gauge resistance caused by the unit strain of the resistance strain gauge, in the embodiment:

$$GF = \frac{dR/R}{\varepsilon},$$

dR/R is a resistance change rate, ε is a mechanical strain of a material; the effective gauge factor (GF_eff) is a ratio of the actual resistance change to the ideal strain assuming that the semiconductor film has no effect on the structural strength. For a specific structure, when the external force is given, the deformation of the structure is determined. However, after a semiconductor film with a larger elastic modulus such as silicon (Si) is pasted, the deformation of Si is generally smaller than the deformation of the carrier structure, and as the film thickness increases, the strain deformation at the film becomes smaller, and the corresponding resistance change decreases, that is, the effective GF decreases with the increase of the thickness of the film.

Figure 1A:
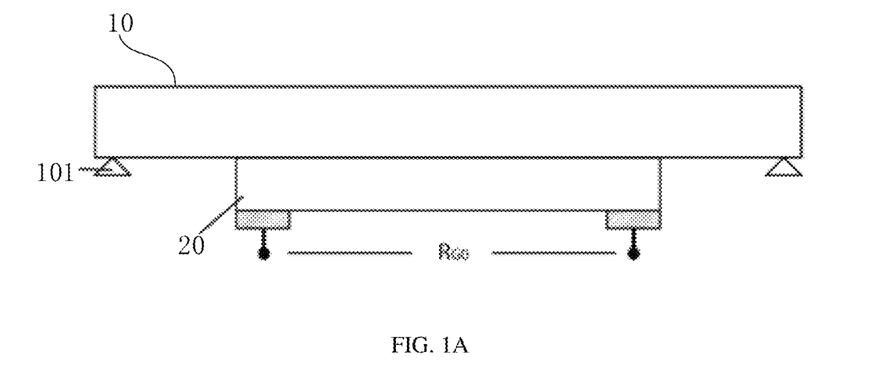
FIG. 1A is an exemplary strain sensing film deposited on a substrate to form a variable resistor according to an embodiment of the present application.
Figure 1B:
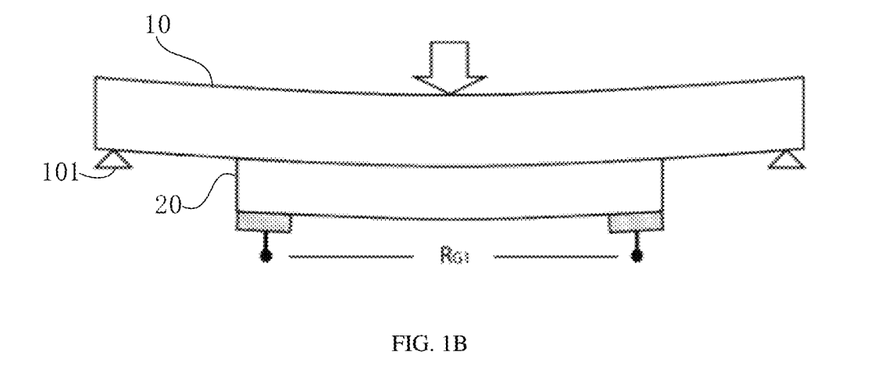
FIG. 1B is an exemplary strain sensing film deposited on a substrate under an applied force provided according to an embodiment of the present application.
Figure 2:
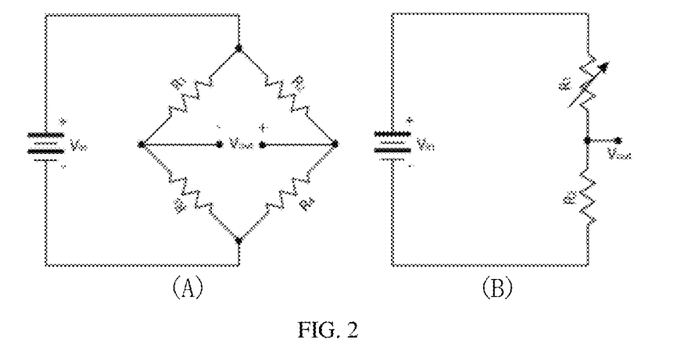
FIG. 2 is an exemplary Wheatstone bridge provided according to an embodiment of the present application, wherein one arm R1 of the bridge is replaced by a piezoresistive resistor, and R2, R3, R4 are reference resistors.

The main types of pressure sensors are based on piezoresistive strain gages or their variants, in which piezoresistive materials are used where the conductivity or resistivity of the strain gauge changes when the material is in a stress state. In one common form of such strain gauges, thin strips of piezoresistive material are deposited or attached or adhered with a substrate to form a variable resistor. FIG. 1A shows an exemplary strain sensing film deposited on substrate 10 to form a variable resistor. Electrically contacting is performed to measure the resistance of resistor $R_{G0}$ of the strain gage 20, two mechanical supports 101 are shown for ease of demonstration, the mechanical supports 101 can use any other design of the support structure, so long as the structure can predictably and repeatably translate the applied force into localized strain. FIG. 1B shows an exemplary strain gauge deposited on the substrate 10 under an applied force, and the resistance of the structure now becomes $R_{G1}$, as shown in FIG. 1B, any deformation of the substrate 10 can cause the resistance change of a variable resistor R1, and by measuring the change in resistance (for example, using the Wheatstone bridge structure shown in FIG. 2a), the strain or applied force can be calculated. The deformation of the substrate can also be measured using a half-bridge, as shown in FIG. 2B, where R1 is a variable resistor.

In an embodiment, FIG. 2A is an exemplary Wheatstone bridge, the resistor R1 is a piezoelectric resistor, the resistor R2, the resistor R3, and the resistor R4 are reference resistors, and the resistance change of the resistor R1 can be calculated according to the resistor R2, the resistor R3, the resistor R4, the input voltage $V_{in}$ and the output voltage $V_{out}$. Since the resistance of the piezoelectric resistor R1 is related to the strain and the force of the strain sensing film, therefore, the resistance change of the resistor R1 obtained through calculating can calculate the strain and force of the strain sensing film.

FIG. 2B is a half-Wheatstone bridge, the resistor R1 is a piezoelectric resistor and the resistor R2 is a reference resistor, the resistance change of resistor R1 can be obtained through calculating the resistor R2, the input voltage $V_{in}$ and output voltage $V_{out}$, since the resistance of the piezoelectric resistor R1 is related to the strain and force of the strain sensing film, the strain and force of the strain sensing film can be calculated by calculating the resistance change of the resistor R1.

Figure 3A:
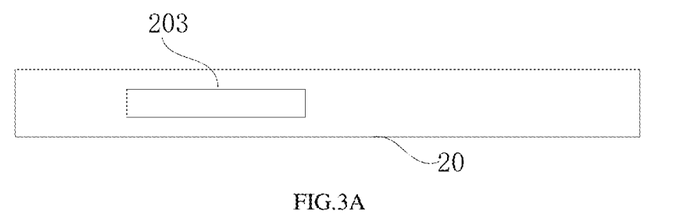
FIG. 3A and FIG. 3B are two exemplary structural schematic diagrams of a strain sensing film provided according to an embodiment of the present application.

Referring to FIG. 3A, the strain sensing film in the embodiment includes a semiconductor film 20, a temperature sensor 203 is provided in the semiconductor film 20.

In the embodiment, the temperature sensor 203 is disposed in in the semiconductor film 20, the temperature change in the deformation region is accurately measured, therefore the resistance change caused by the temperature change in the deformation region is compensated, which prevents the measurement errors of the external temperature sensor from being unable to measure the accurate temperature of the semiconductor film 20.

Figure 3B:
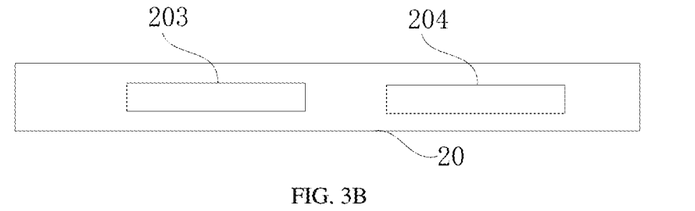

In one embodiment, as shown in FIG. 3B, the strain sensing film is further provided therein with a signal processing circuit 204, and the signal processing circuit 204 is configured for receiving the detected temperature signal output by the temperature sensor 203, and determining a sensitivity adjustment for a sensor according to a correlation table that reflects a correlation between an effective gauge factor and a temperature.

In the embodiment, the signal processing circuit can be integrated in the semiconductor film, and the signal processing circuit 204 is connected with the Wheatstone bridge and the temperature sensor. By applying the temperature value detected by the temperature sensor 203 to the preset sensitivity calibration algorithm, to correct the temperature effect of the strain sensing film, the sensitivity calibration algorithm can be obtained based on theoretical calculations or data measured under controlled conditions, or grouped and obtained based on theoretical calculations and data measured under controlled conditions.

In one embodiment, the number of temperature sensors 203 disposed in the semiconductor film 20 is multiple, and the signal processing circuit 204 can obtain the sensor temperature by weighted calculating of a plurality of detected temperature signals output by the plurality of temperature sensors, and then the corresponding effective gauge factor is obtained from the sensor temperature based on weighted calculating.

In one embodiment, the semiconductor film 20 includes at least one selected from a group consisting of a silicon (Si) film, a germanium (Ge) film, a gallium arsenide (GaAs) film, a gallium nitride (GaN) film, a silicon carbide (SiC) film, and a zinc sulfide (ZnS) film, and a zinc oxide (ZnO) film.

In one embodiment, the semiconductor film 20 can include a single crystal, polycrystalline or amorphous material in any orientation.

In one embodiment, the semiconductor film 20 is provided with at least one resistor.

In one embodiment, the semiconductor film 20 is provided with a plurality of resistors, the plurality of resistors form a Wheatstone bridge or a half-Wheatstone bridge, and the plurality of resistors arranged to be adjacent to each other.

In the embodiment, the plurality of resistors in the Wheatstone bridge or the half-Wheatstone bridge are adjacent to each other and insulated from each other. In the special application, the good thermal conductivity of the semiconductor film 20 can be used to realize consistent temperature changing among the plurality of resistors in the Wheatstone bridge when the temperature of the semiconductor film 20 is changed, therefore the pressure detection errors caused by the temperature difference of the resistors in the same semiconductor film 20 is avoided.

In an embodiment, the temperature sensor 203 outputs a detected temperature signal through the temperature contact electrode, the signal processing circuit 204 can be provided outside the semiconductor film 20, and the signal processing circuit 204 receives the detected temperature signal output by the temperature sensor 203 disposed in the semiconductor film 20, and the temperature effect of the strain sensing film can be corrected based on the detected temperature signal. For example, the effective gauge factor can be obtained by applying the temperature value detected by the temperature sensor 203 to a preset sensitivity calibration algorithm. The sensitivity calibration algorithm can be obtained based on theoretical calculations or data measured under controlled conditions, or grouped and obtained based on theoretical calculations and data measured under controlled conditions.

In one embodiment, the signal processing circuit 204 further includes a voltage source, a current source, an amplification circuit, an analog-to-digital converter (ADC), a digital-to-analog converter (DAC), a multiplexer (MUX), a micro control unit (MCU) or any other common signal processing and control circuit.

In a specific application embodiment, the strain sensing film can operate in a DC mode, and can also operate in an AC mode or a pulsed mode. The strain-sensing film can also operate in a low-power sleep mode, switching to a high-power detection mode an external trigger event, and switching back to a low-power mode when a trigger event passes.

In one embodiment, the semiconductor film 20 is provided with at least one resistor and a bridge contact electrode connected with a Wheatstone bridge or a half-Wheatstone bridge, and configured for outputting a bridge voltage signal.

In one embodiment, the temperature sensor is connected to the signal processing circuit through the contact electrode, or the temperature sensor is connected to an external control unit through the contact electrode, and the external control unit is an external signal processing circuit.

In one of the embodiments, the temperature contact electrode can include conductive contact formed by common printing techniques such as screen printing, inkjet printing, roll-to-roll printing, etc. Further, the conductive contact can be thermally annealed to form Ohmic contact. The electrode contact can also be prepared by binding gold wires.

In one of the embodiments, the bridge contact electrode can include conductive contact formed by common printing techniques such as screen printing, inkjet printing, roll-to-roll printing, etc. Further, the conductive contact can be thermally annealed to form Ohmic contact. The electrode contact can also be prepared by binding gold wires or soldering process.

In one of the embodiments, the temperature contact electrode can also be formed by solder ball and flip-chip processes.

In one of the embodiments, the bridge contact electrode can also be formed by solder ball and flip-chip processes.

In a specific application embodiment, the effective gauge factor of the semiconductor film changes with the change of temperature, the higher the temperature, the smaller the effective gauge factor. Therefore, when using the detected temperature signal output by the built-in temperature sensor to calibrate the strain sensing film, through the preset calibration test, the relationship table between the effective gauge factor and temperature can be obtained, and then the corresponding effective gauge factor is obtained through the temperature value corresponding to the detected temperature signal output by the temperature sensor, and the pressure value detected by the strain sensing film is determined based on the calibrated effective gauge factor.

In one of the embodiments, the semiconductor film is provided with a plurality of resistors, and the plurality of resistors can form a Wheatstone bridge or a half-Wheatstone bridge.

In one embodiment, the semiconductor film is provided with at least two resistors, one resistor and at least another resistor respond differently to a strain.

In the embodiment, at least two resistors on the semiconductor film have different responses to the strain, which can be achieved by setting the two resistors with different thicknesses, different placement positions, different preparation materials, and different shapes of the resistors.

In an embodiment, one of the resistors has a different gauge factor than at least one other resistor.

Since the gauge factor of one of the resistors on the semiconductor film is different from that of at least another resistor, in the process of strain sensing, at least two different electrical signals are generated in the two resistors, or at least two kinds of resistance values are generated at the same time. Therefore, the sensitivity of the semiconductor film can be increased, and an accurate strain signal can still be detected in a small strain environment.

In one of the embodiments, at least two resistors are placed in different directions, or at least two resistors are made of different piezoresistive materials, or at least two resistors have different thicknesses, and so on, so that one of the two resistors on the semiconductor film has a different gauge factor from at least one other resistor.

In one embodiment, the semiconductor film is provided with at least two resistors, one resistor and at least one other resistor are placed in different directions.

For p-type doped (100) crystalline silicon materials, which have two mutually perpendicular directions, the gauge factors are basically the same in magnitude and opposite in sign, and the TCR has little correlation with the direction. Therefore, by arranging two resistors mutually perpendicular to each other on the same semiconductor film, the signal amount output by the strain sensing film under the same deformation can be enhanced, and the influence of the ambient temperature on the signal amount can be reduced.

Figure 4:
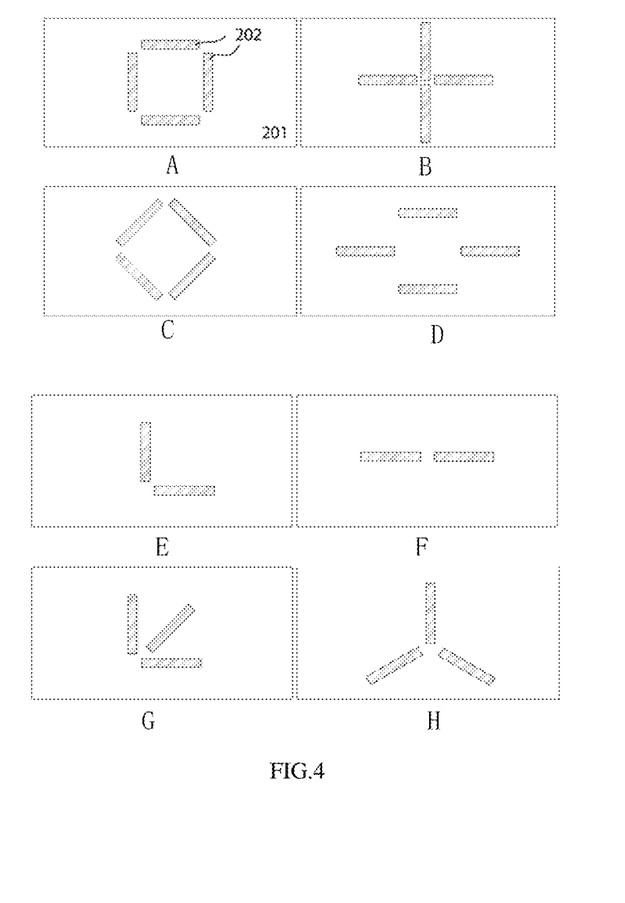
FIG. 4 provides eight exemplary illustrative arrangements of resistors on a strain sensing film provided according to an embodiment of the present application.

Referring to FIG. 4, 201 represents the semiconductor film on which the resistor is built, but is not drawn to scale of the actual semiconductor film. 202 represents resistors deposited on the semiconductor film. The rectangular shape of the resistors shown in FIG. 4 does not represent the actual shape of the resistor, but is used to indicate the direction of current flow, which flows parallel to the long sides of the rectangle. Actual resistors can contain different aspect ratios, which may even be a combination of multiple sections, each with its own aspect ratio. In addition, the location of each resistor is illustrative and may not be the actual location, as is the case for all configurations in FIG. 4. FIG. 4A to FIG. 4H only show the relationship of the orientation of the resistors, not the positions of the resistors.

The semiconductor film 201 in FIG. 4A is provided with four resistors, and each resistor is perpendicular to the other two resistors.

Four resistors are provided on the semiconductor film 201 in FIG. 4A, and each resistor is perpendicular to the other two resistors.

FIG. 4B represents the same configuration, and both include four resistors, each of which is perpendicular to the other two resistors, each of which is parallel to at least one side of the semiconductor film 201.

The semiconductor film 201 in FIG. 4C is provided with four resistors, each resistor is perpendicular to the other two resistors, and each resistor is arranged at an angle of 45 degrees with at least one side of the semiconductor film 201.

The semiconductor film 201 in FIG. 4D is provided with four resistors, and the four resistors are arranged in parallel with each other.

In an embodiment, the four resistors in FIG. 4D are arranged in parallel.

The semiconductor film 201 in FIG. 4E is provided with two resistors, and the two resistors are arranged perpendicular to each other.

The semiconductor film 201 in FIG. 4F is provided with two resistors, and the two resistors are arranged in parallel with each other.

In one embodiment, the two resistors in FIG. 4f are arranged in parallel.

The semiconductor film 201 in FIG. 4G is provided with three resistors, and the angle of two adjacent resistors is 45 degrees.

The semiconductor film 201 in FIG. 4H is provided with three resistors, and the angle of two adjacent resistors is 60 degrees, or 120 degrees.

In the embodiment, one of the resistors is located in a different direction than at least one other resistor, during the strain sensing process, due to the anisotropy of the semiconductor material, the gauge factors in the two directions are different, or different electrical signals are generated in the two resistors, or two resistance values are generated at the same time. In an embodiment of the present application, the "direction" of the resistor refers to the direction of the current flowing through the resistor, rather than the geometric shape of the resistor.

In one of the embodiments, the semiconductor film is provided with at least two resistors, the gauge factor of one resistor is different from that of at least another resistor.

Referring to FIG. 4, in an embodiment, the semiconductor film 201 includes two resistors forming a half-Wheatstone bridge, the gauge factor of one resistor is different from the gauge factor of the other resistor.

In one of the embodiments, one of the resistors is oriented perpendicular to at least one other resistor.

In the embodiment, two mutually perpendicular resistors are arranged on the same semiconductor film to enhance the signal amount output by the strain sensing film under the same deformation.

In one embodiment, the semiconductor film 201 includes two resistors forming a half-Wheatstone bridge, and the strain level of one resistor at a pressure sensing device is different from the strain level of the other resistor at the pressure sensing device.

In the embodiment, when a strain sensing is happened on the strain sensing film, the strain factor of one of the resistors is different from the strain factor of at least another resistor.

In an embodiment, the direction of current flow in at least one resistor is perpendicular to the direction of current flow in at least another resistor.

In the embodiment, the semiconductor film 201 includes two resistors forming a half-Wheatstone bridge, and among the two resistors forming the half-Wheatstone bridge, the current direction in at least one resistor is perpendicular to the direction of current flow of the another resistor.

In an embodiment, the semiconductor film is provided with a Wheatstone bridge, and the Wheatstone bridge includes a first resistor, a second resistor, a third resistor, and a fourth resistor; the second resistor and the third resistor have positive gauge factors, and the first resistor and the fourth resistor have negative gauge factors.

Figure 5:
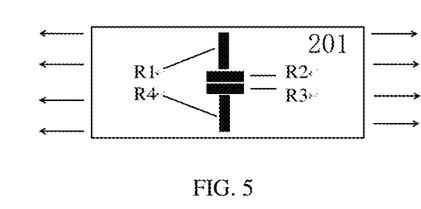
FIG. 5 is a schematic diagram of a strain sensing film provided according to an embodiment of the present application.

In the embodiment, as shown in FIG. 5, the semiconductor film 201 is provided with the first resistor R1, the second resistor R2, the third resistor R3, and the fourth resistor R4. The gauge factors in the directions are basically the same in magnitude and opposite in sign. Therefore, by arranging the second resistor R2 and the first resistor R1 to be perpendicular to each other, and the third resistor R3 to the fourth resistor R4 to be perpendicular to each other, by arranging two resistors with positive gauge factors and two resistors with negative gauge factors on the same semiconductor film, the signal amount output by the Wheatstone bridge under the same deformation is enhanced In one embodiment, $dR2/R2=GF2\times\varepsilon$, $dR1/R1=GF1\times\varepsilon$, the Wheatstone bridge voltage signal $dU=Vcc/2\times(dR2/R2-dR1/R1)=Vcc\times dR2/R2$; GF2 is the pressure sensing coefficient of the second resistor R2, GF1 is the pressure sensing coefficient of the first resistor R1, $GF1=-GF2$, $\varepsilon$ is the strain at the Wheatstone bridge, and Vcc is the supply voltage of the Wheatstone bridge.

In this embodiment, the semiconductor film 201 is provided with four resistors, and by adjusting the angles of the four resistors, for example, the second resistor R2 and the third resistor R3 have positive gauge factors, the first resistor R1 and the fourth resistor R4 have negative gauge factors. At this time, under the same deformation, $dR2/R2=-dR1/R1$, and the Wheatstone bridge voltage signal $dU=Vcc/2\times(dR2/R2-dR1/R1)=Vcc\times dR2/R2$, at this time, the signal amount of the Wheatstone bridge can be significantly increased.

In an embodiment, the thickness of the semiconductor film 201 is less than or equal to 70 μm.

In an embodiment, the thickness of the semiconductor film 201 is less than or equal to 50 μm.

In an embodiment, the thickness of the semiconductor film 201 is less than or equal to 30 μm.

In an embodiment, the thickness of the semiconductor film 201 is less than or equal to 25 μm.

In an embodiment, the thickness of the semiconductor film 201 is less than or equal to 20 μm.

In an embodiment, the thickness of the semiconductor film 201 is less than or equal to 15 μm.

In an embodiment, the semiconductor film 201 in the above-mentioned embodiment can be a silicon film, and the elastic modulus of the silicon material is equivalent to that of steel, about 160 GPa, the greater the thickness of the semiconductor film 201, the more difficult to deform. Therefore, by reducing the thickness of the silicon wafer, the thickness of the silicon wafer is less than or equal to 70 μm, or less than or equal to 50 μm, or less than or equal to 30 μm, or less than or equal to 25 μm, or less than or equal to 20 μm, or less than or equal to 15 μm. At this time, the silicon film will become soft and easily deformed, which improves the efficiency of strain transmission from the substrate to the silicon film, thereby increasing the effective sensitivity coefficient of the silicon film and significantly increasing the signal amount.

An embodiment of the present application further provides a pressure sensor, including: a substrate, at least one side surface of the substrate is provided with the strain sensing film according to any one of the above.

In the embodiment, the substrate includes a common substrate used for circuits such as printed circuit boards, flexible printed circuit (FPC) boards, and further includes common substrates used in printable electronics, such as polyamide Imine (PI) sheet, Polyethylene terephthalate (PET) sheet, Polyurethane (PU) sheet, Polycarbonate (PC) sheet, Epoxy sheet, and further includes glass fiberboard (FR-4), glass sheet, metal sheet, paper, composite sheet, wood sheet, and ceramic sheet, etc.

Figure 6:
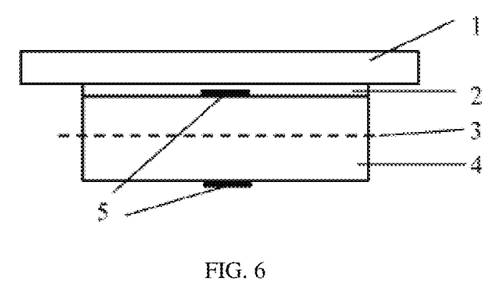
FIG. 6 is a schematic diagram of a pressure sensor provided according to an embodiment of the present application.

In a specific application embodiment, as shown in FIG. 6, the strain sensing films 5 are arranged on both sides of the substrate 4, 3 is the neutral surface of the substrate deformation, and the substrate 4 is pasted on the panel 1 by the double-sided adhesive tape 2. The elastic modulus of the double-sided tape is much smaller than that of the panel 1, and the panel 1 can be metal, glass, plastic, ceramic, wood, or the like. By pressing, the panel 1 is deformed, and then the sensor module is deformed through the double-sided tape. The deformation neutral surface 3 of the pressure sensor module is the middle position of the sensor shown in the figure. The deformation amounts of the upper and lower sides of the module are the same in value and opposite in sign. Placing the strain sensing film on the upper and lower sides can generate twice the signal and improve the signal-to-noise ratio compared to placing the strain sensing film on one side.

An embodiment of the present application further provides a mixed strain sensing system, the mixed strain sensing system includes: a substrate; and the strain sensing film according to any one of the above, and the strain sensing film is adhered with the substrate through an adhesive.

In the embodiment, the strain sensing film is combined with the signal processing circuit, and the strain sensing film is adhered with the substrate, or at least one strain sensing film and a signal processing circuit are placed on the substrate together to form a mixed strain sensing system to provide high sensitivity and flexibility for various application scenarios.

In one of the embodiments, the method for pasting includes gluing, mechanical fixing, surface mounting (SMT) and so on.

Fields of application of such strain sensing systems include but are not limited to strain sensing, or force sensing, or touch sensing or tactile sensing of the smart-phone in any human-machine interface or machine-machine interaction, tablet computers, personal computers, touch screens, virtual reality (VR) systems, gaming systems, consumer electronics, vehicles, scientific instruments, toys, remote controls, industrial machinery, and biomedical sensors, to monitor heart rate, blood pressure, movement and acceleration of skin, muscles, bones, Joints and other body parts; robotic sensors configured to measure touch, local pressure, local tension, motion and acceleration of any part of the robot; vibration sensors for buildings, bridges and any other man-made structures; sensors configured to monitor strain, pressure, motion, acceleration of any part of a vehicle used in land, air, water, or space; motion, acceleration, and pressure sensors that can be integrated into smart fabrics; and any other applications that need to measure local static or dynamic deformation, displacement, or strain.

The above are only optional embodiments of the present application, and are not intended to limit the present application. Various modifications and variations of this application are possible for those skilled in the art. Any modification, equivalent replacement, improvement, etc. made within the spirit and principle of this application shall be included within the scope of the claims of the present application.

What is claimed is:

1. A strain sensing film, comprising:
a semiconductor film, wherein a temperature sensor is arranged in the semiconductor film,
wherein the strain sensing film is provided therein with a signal processing circuit configured for receiving a detected temperature signal output by the temperature sensor and configured for determining a sensitivity adjustment for a sensor according to a correlation table that reflects a correlation between an effective gauge factor and a temperature; and
the temperature sensor is configured to compensate for a resistance change caused by a temperature change in a deformation region.

2. The strain sensing film according to claim 1, wherein the semiconductor film comprises a silicon film, a germanium film, a gallium arsenide film, a gallium nitride film, a silicon carbide film, a zinc sulfide film, and/or a zinc oxide film.

3. The strain sensing film according to claim 1, wherein the semiconductor film is provided with at least one resistor and a bridge contact electrode connected with a Wheatstone bridge or a half-Wheatstone bridge, and configured for outputting a bridge voltage signal.

4. The strain sensing film according to claim 1, wherein the semiconductor film is provided with a plurality of resistors, the plurality of resistors form a Wheatstone bridge or a half-Wheatstone bridge, and the plurality of resistors arranged to be adjacent to each other.

5. The strain sensing film according to claim 1, wherein the semiconductor film is provided with a temperature contact electrode connected to the temperature sensor and configured for outputting a detected temperature signal.

6. The strain sensing film according to claim 1, wherein the semiconductor film is provided with a bridge contact electrode connected with a Wheatstone bridge or a half-Wheatstone bridge, and configured for outputting a bridge voltage signal.

7. The strain sensing film according to claim 1, wherein the semiconductor film is provided with at least two resistors, one resistor and at least another resistor respond differently to a strain.

8. The strain sensing film according to claim 1, wherein the semiconductor film is provided with at least two resistors, one resistor and at least another resistor are placed in different directions.

9. The strain sensing film according to claim 1, wherein the semiconductor film is provided with at least two resistors, one resistor and at least another resistor have different gauge factors.

10. The strain sensing film according to claim 1, wherein the semiconductor film is provided with at least two resistors, one resistor is perpendicular to at least another resistor.

11. The strain sensing film according to claim 1, wherein a thickness of the semiconductor film is less than or equal to 70 μm.

12. The strain sensing film according to claim 1, wherein a thickness of the semiconductor film is less than or equal to 50 μm.

13. The strain sensing film according to claim 1, wherein a thickness of the semiconductor film is less than or equal to 30 μm.

14. The strain sensing film according to claim 1, wherein a thickness of the semiconductor film is less than or equal to 25 μm.

15. The strain sensing film according to claim 1, wherein a thickness of the semiconductor film is less than or equal to 20 μm.

16. The strain sensing film according to claim 1, wherein a thickness of the semiconductor film is less than or equal to 15 μm.

17. A pressure sensor, comprising: a substrate, and at least one side surface of the substrate is provided with a strain sensing film comprising a semiconductor film, wherein a temperature sensor is arranged in the semiconductor film;
wherein the strain sensing film is provided therein with a signal processing circuit configured for receiving a detected temperature signal output by the temperature sensor and configured for determining a sensitivity adjustment for a sensor according to a correlation table that reflects a correlation between an effective gauge factor and a temperature; and
the temperature sensor is configured to compensate for a resistance change caused by a temperature change in a deformation region.

18. A strain sensing system, comprising:
a substrate; and
a strain sensing film comprising a semiconductor film, wherein a temperature sensor is arranged in the semiconductor film, wherein the strain sensing film is adhered with the substrate by an adhesive;
wherein the strain sensing film is provided therein with a signal processing circuit configured for receiving a detected temperature signal output by the temperature sensor and configured for determining a sensitivity adjustment for a sensor according to a correlation table that reflects a correlation between an effective gauge factor and a temperature; and
the temperature sensor is configured to compensate for a resistance change caused by a temperature change in a deformation region.

* * * * *